United States Patent [19]
Wallace et al.

[11] Patent Number: 5,991,004
[45] Date of Patent: Nov. 23, 1999

[54] LENS FOCUS SHIFT SENSOR

[75] Inventors: John D. Wallace, Newburyport; Shepard D. Johnson, Andover, both of Mass.

[73] Assignee: MRS Technology, Inc., Chelmsford, Mass.

[21] Appl. No.: 08/627,892

[22] Filed: Apr. 3, 1996

[51] Int. Cl.⁶ .......................... G03B 27/42; G03B 27/54; G01B 11/14
[52] U.S. Cl. .............................. 355/53; 355/67; 356/399; 356/400; 356/401; 356/374
[58] Field of Search .................... 355/53, 67; 250/201.2, 250/201.4, 201.5, 559.22, 559.29, 559.31

[56] References Cited

U.S. PATENT DOCUMENTS

| | | | |
|---|---|---|---|
| 4,549,084 | 10/1985 | Markle | 250/548 |
| 5,189,494 | 2/1993 | Muraki | 356/401 |

FOREIGN PATENT DOCUMENTS

| | | |
|---|---|---|
| 0253442 | 1/1988 | European Pat. Off. . |
| 55-33679 | 3/1980 | Japan . |
| 61-117831 | 5/1986 | Japan . |
| 63-185024 | 7/1988 | Japan . |
| 4-186716 | 7/1992 | Japan . |

OTHER PUBLICATIONS

Gregoris, Dennis, and Ristic, Velimir M., "Moire interferometric focusing system for optical microlithography," *Applied Optics*, 2 20 (Oct. 15, 1987).

*Primary Examiner*—R. L. Moses
*Assistant Examiner*—Shival Virmani
*Attorney, Agent, or Firm*—Hamilton, Brook, Smith & Reynolds, P.C.

[57] ABSTRACT

A focus shift sensor includes a light source which directs light through a first grating to form a pattern of light. The pattern is directed through the lens which images the pattern at a second grating. The two gratings have different periods such that the second grating generates a pattern of Moire fringes which are projected onto a CCD array. The second grating is preferably tilted with respect to the plane of the image of the pattern from the first grating such that only a portion of the second grating is within the range of focus of the lens. As a result, a pattern of shortened Moire fringes is produced. As the range of focus shifts along the second grating, the Moire fringes move along the CCD array. The movement of the fringes is tracked and the system is adjusted to maintain the location of the focal plane of the lens at a desired location.

43 Claims, 5 Drawing Sheets

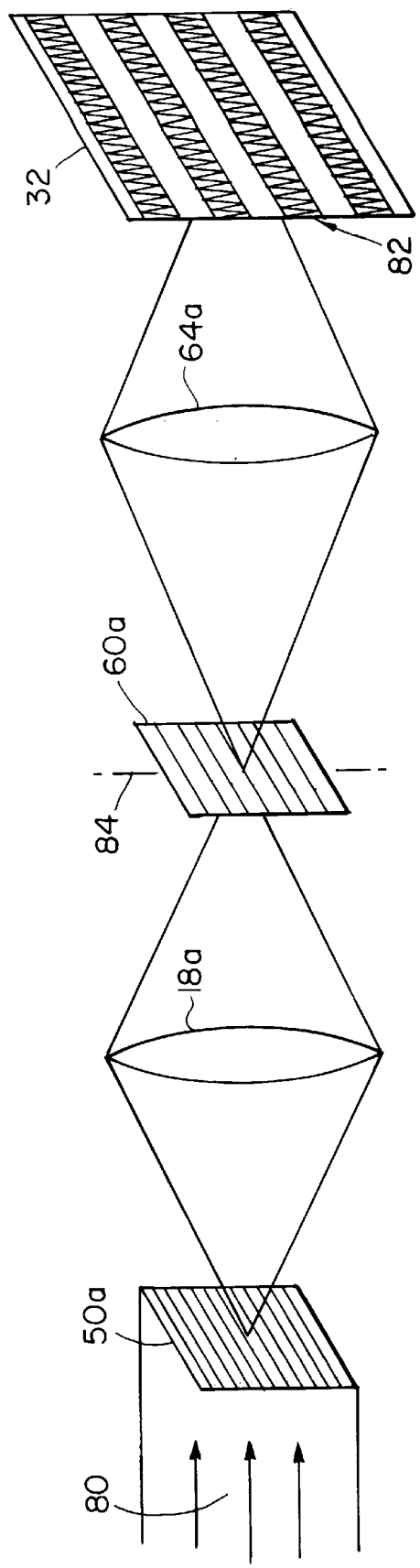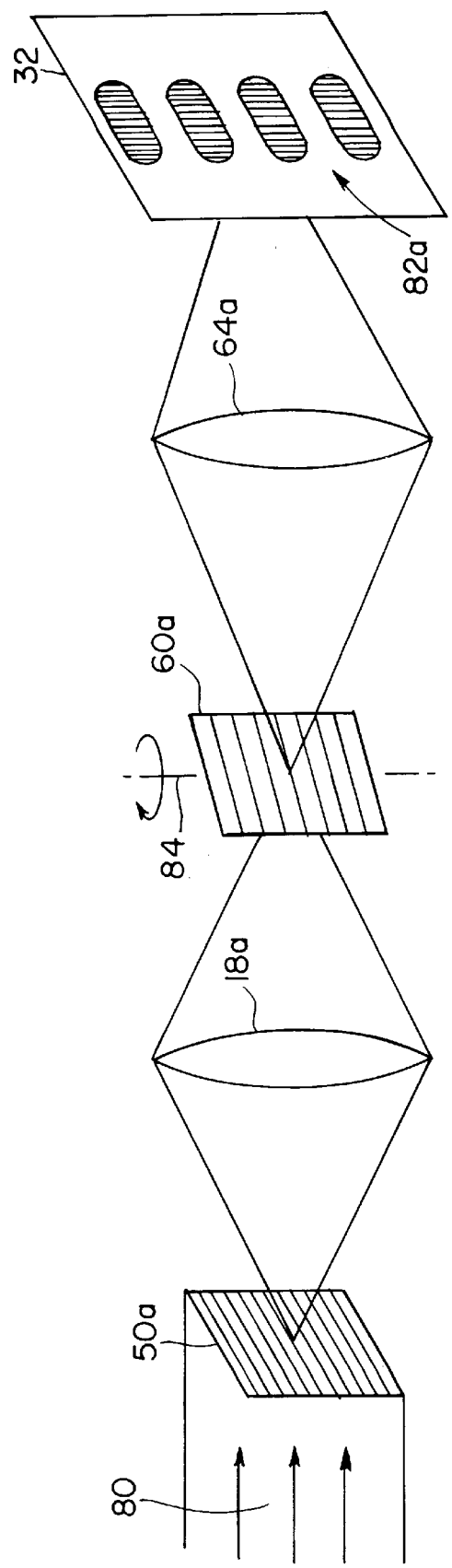

LENS FOCUS SHIFT SENSOR

BACKGROUND OF THE INVENTION

In many optical systems such as photolithography systems, an object such as a reticle is illuminated by a light source. Light from the object passes through a projection or exposure lens which forms an image of the object at an image plane. In photolithography systems, a workpiece such as a semiconductor wafer or flat panel display substrate is mounted on a movable stage at the image plane, and an image of the illuminated reticle is formed by the projection lens on the top surface of the workpiece.

In today's semiconductor and flat panel display industries, increasingly dense circuits are required on wafer and display substrates. The increased circuit density demands smaller feature sizes and line widths in the images projected onto the substrates. Feature sizes in the sub-micrometer range are increasingly in demand.

With such small required feature sizes, even small shifts in the image plane or focal plane of the lens can adversely affect the performance of the system. If the focus shifts such that the workpiece surface moves beyond the depth of focus of the lens, then the reticle pattern cannot be accurately reproduced on the substrate.

Assuming a mechanically stable system, the main cause of focal plane shift is thermal changes induced in the lens by absorption of a portion of the exposure light. The resultant heating induces changes in the refractive indices of the optical elements as well as in their curvatures. The effect is a shift in the focal plane of the lens over time. The time constant of the shift is usually several minutes, which can be of the same order as the time needed to completely expose a substrate. Thus, if the shift is a significant portion of the depth of focus, it can interfere with proper exposure of the substrate.

Other causes of focal plane shift include changes in atmospheric air pressure, temperature and humidity. However, these changes occur slowly and, hence, do not cause significant problems during exposure of a substrate.

Prior systems have attempted to compensate for focal plane shift due to lens heating. In one method, a block of metal is placed in the illuminator where it receives a portion of the light intended for the lens. The block is made to have heating and cooling time constants approximately equal to those of the lens. The temperature of the block is monitored with a thermocouple. From the temperature information, the focal plane shift of the lens is computed and an appropriate compensation is made at the plane of the substrate.

In another method, the focal plane shift of the lens over time at full light intensity is characterized and the data is stored. The actual amount of light that passes through the lens during an exposure is calculated by multiplying the full intensity value by the transmission percentage of the reticle being used during the exposure. From this calculated value, compensation is made at the substrate plane as the exposure is executed.

These prior approaches are essentially modeling approaches in which a simulated focus shift is calculated and for which compensation is made. As with any simulation, inaccuracies are introduced by the imperfection of the model and the absence of actual measurement.

Most photolithography systems also include another type of focus sensor, commonly referred to as a stage sensor. The device is used to determine the position of best focus of the system. One such stage sensor works in conjunction with a grating formed on the reticle. The system illuminator projects light through the grating onto the system projection lens which forms an image of the grating on a detector located on the system stage. The detector can include a single slit aperture over an array of optical detectors or a single detector. Instead of a single slit, a second grating having the same period as the first grating can be used.

This prior art stage sensor determines the position of best focus between the stage and the lens by implementing a series of movements in three dimensions x, y, z, where x and y are orthogonal dimensions in the plane of the stage and z is the dimension along the optical axis of the lens which connects the lens with the stage.

In the best focus position sensing process, at each of a plurality of incremental z positions, the stage is moved in the x and/or y dimensions to scan the aperture or grating on the stage under the image of the reticle grating. The best focus position in the z dimension is the z position which provides the highest amplitude oscillating signal at the detector as the image of the reticle grating is scanned.

While this process is highly effective at setting up the photolithography machine at the proper focus position, it is impractical to use during the exposure procedure to adjust for shift in focus due to thermal effects. It is very time-consuming in that it requires intricate movement in two or three dimensions while the optical signal projected from the reticle is detected and analyzed.

SUMMARY OF THE INVENTION

The present invention is directed to a lens focus shift sensor and a method for sensing focus shift in a lens which can be used in a photolithography system. The sensor includes a first optical element which is illuminated by a light source of the sensor. The light source directs light through the first optical element to generate a first light pattern. The first light pattern is then directed through the lens which forms an image of the pattern at a second optical element. The second optical element generates a pattern of Moire fringes from the first light pattern. The Moire fringes are directed onto a detection system which senses a change in position of the Moire fringes to indicate the shift in focus of the lens and to generate a signal indicative of the shift in focus.

In one embodiment, the first optical element is preferably a first grating and the second optical element is preferably a second grating. The periods of the gratings are preferably different such that when the pattern of lines from the first grating is imaged onto the second grating, the pattern of Moire fringes is generated.

In a preferred embodiment of the focus shift sensor and photolithography system of the invention, the first grating is located such that the optical path length between the first grating and the input end of the lens is the same as that between the reticle and the input end of the lens. That is, the first grating is effectively located and preferably rigidly fixed at the object plane of the lens. Likewise, the second grating is located such that the optical path length between the output end of the lens and the second grating is the same as that between the output end of the lens and the top surface of the substrate. That is, the second grating is effectively located at the nominal image plane of the lens.

In one embodiment, the invention also includes a controller which receives the signal indicative of focus shift and compensates for the shift. The controller can include a processor which issues command signals to an actuating system which moves the lens relative to the workpiece surface and/or the workpiece surface relative to the lens to adjust the surface within the focal depth of the lens.

Moire fringes are generated when the second grating is within the depth of focus of the projection lens such that the pattern of lines from the first grating is imaged at the second grating. Where the second grating is not within the depth of focus of the projection lens, no Moire pattern will be generated since the pattern from the first grating is out of focus at the second grating.

In a preferred embodiment of the invention, the second grating is tilted such that only a portion of it is within the depth of focus of the lens. It is only that portion which generates the Moire fringes. The Moire fringes are therefore shorter than they would be if the entire second grating were used to generate them. In this embodiment, as the focal plane of the projection lens shifts, the portion of the second grating that falls within the depth of focus also shifts. As the focal plane moves along the second grating, the portion of the second grating used to generate the Moire fringes changes. As a result, the Moire fringes change position. In this embodiment, the shift in focus of the lens is detected by detecting the position change of the Moire fringes.

Preferably, the Moire fringes produced at the second grating are imaged onto a two-dimensional CCD array. The array is positioned so that as the focal plane of the projection lens shifts, the Moire fringes move along the array. The fringe movement is tracked to determine their position change.

Preferably, each vertical column of CCD pixels in the array is analyzed to determine the magnitude of the spatial frequency component in the column at the frequency of the Moire pattern. This is preferably done by performing a Fast Fourier Transform (FFT) on each column. The highest magnitude across all of the columns is identified as the center of the Moire pattern.

The movement of the center of the Moire pattern along the CCD columns is representative of shift in focus of the lens. A signal indicative of the focus shift is used to generate control signals which are transmitted to the actuation circuitry to move the lens and/or the substrate stage as required to maintain the focal plane of the lens in a desired position relative to the substrate surface.

In one embodiment, the second grating is mounted within the system rigidly with respect to the lens. Therefore, in this embodiment, movement of the lens relative to the stage has no effect on the position of the Moire pattern on the CCD array. The pattern continues to indicate the amount of focus shift experienced by the lens, regardless of compensation made between the lens and the stage. In this embodiment, the amount of fringe movement is translated to a required amount of lens and/or stage compensation movement. That is, the amount of fringe movement is used to calculate an amount of lens movement relative to the stage required to place the top surface of the substrate at a desired position within the focus of the lens.

In an alternative embodiment, the second grating is mounted in the system rigidly with respect to the stage. In that embodiment, as the lens and/or stage are commanded to move relative to each other to compensate for focus shift, the Moire pattern shifts to a new location on the CCD array. In this embodiment, the actual amount of required lens/stage compensation need not be calculated. Instead, the lens and/or stage can be moved while the position of the Moire pattern on the CCD array is monitored. If the Moire pattern is maintained at a desired location on the array, then the range of focus of the lens is necessarily kept at a desired position relative to the surface of the substrate.

Hence, the present invention provides a focus shift sensing and compensation system which allows for actual through-the-lens shift measurement. No models are used to simulate focus shift. Instead, actual focus shift is detected. The inaccuracies associated with model-based systems are eliminated.

BRIEF DESCRIPTION OF THE DRAWINGS

The foregoing and other objects, features and advantages of the invention will be apparent from the following more particular description of the preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 2A and 2B are schematic diagrams illustrating the effect of tilting the gratings of the invention with respect to each other.

DETAILED DESCRIPTION OF THE INVENTION

Figure 1:
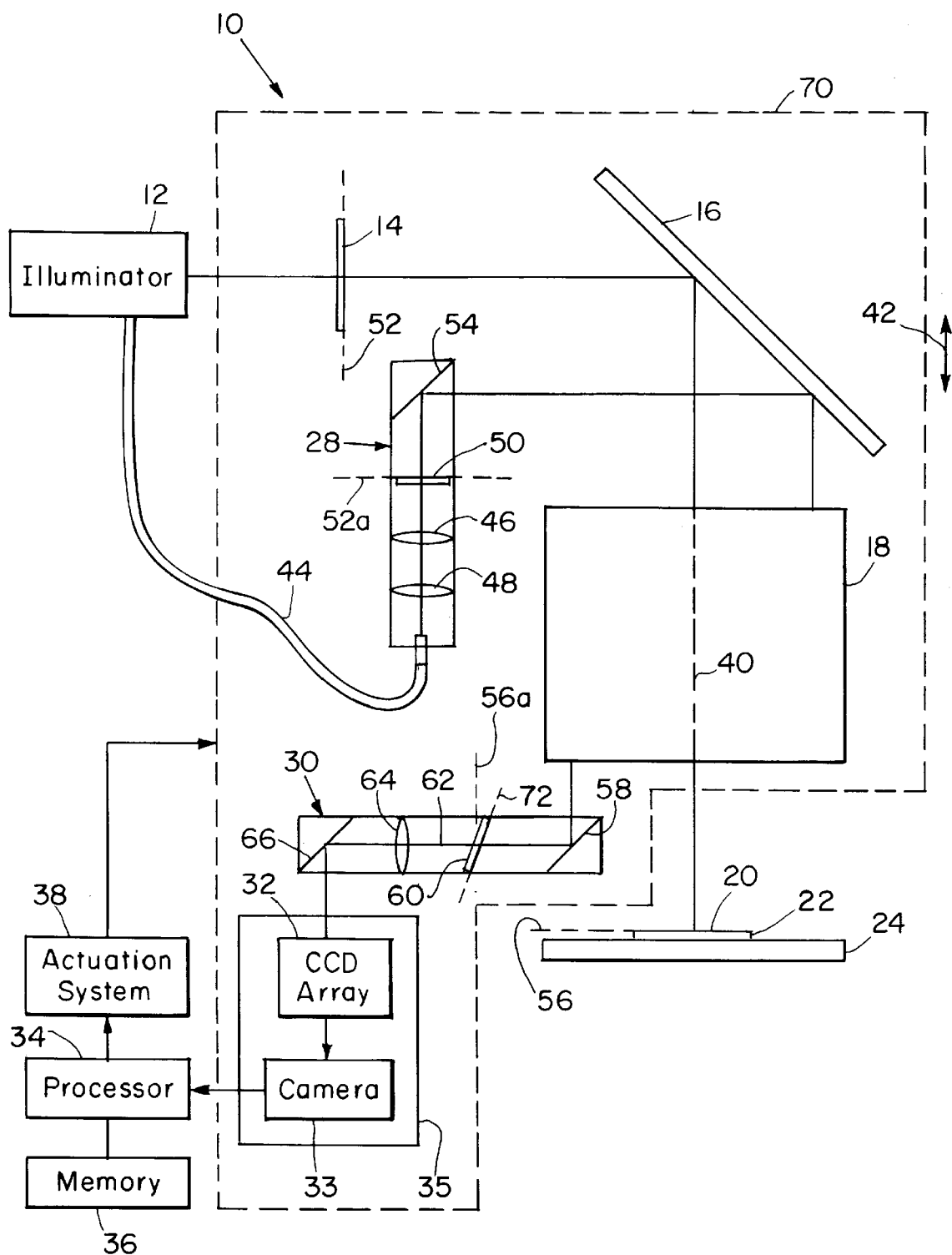
FIG. 1 is a schematic block diagram of the focus shift sensor of the invention in a photolithography system.

FIG. 1 is a schematic block diagram of one preferred embodiment of the photolithography system 10 of the present invention. The system 10 includes a light source such as an illuminator 12 which illuminates a reticle 14 located at an object plane 52. The reticle 14 produces patterned light which is preferably reflected by a fold mirror 16 into a projection lens 18. The projection lens 18 forms an image of the patterned reticle 14 on the top surface 20 of a substrate 22, such as a semiconductor wafer or flat panel display substrate, mounted on a movable stage 24. Ideally, the top surface 20 of the substrate 22 is located at the image plane 56 of the lens 18. It should be noted that the lens 18 actually includes multiple optical components that generate the image of the reticle. However, for clarity it will be referred to herein as a single lens.

The focus shift sensing system of the invention used to sense focus shift in the projection lens 18 includes a second light source preferably in the form of an optical fiber 44 coupled to the illuminator output to provide sensing light, a sensing light input wand 28 which receives the sensing light from the fiber 44, a sensing light output wand 30, a CCD processing system 35 which includes a two-dimensional CCD array 32 and a CCD camera 33, a processor 34 with associated memory 36 and an actuation system 38 used to adjust the distance between the projection lens 18 and the top surface 20 of the substrate 22 preferably by moving the projection lens 18 along its optical axis 40 as indicated by arrow 42. The memory 36 stores software commands and data used by the processor 34 to perform the system functions described in detail herein. The actuation system 38 can include servo and/or stepper motors, slides, bearings and/or other devices used to mount the equipment within the dashed box 70 in a manner that allows movement of the equipment along the axis 40 relative to the stage 24.

To sense focus shift in the lens 18, the illuminator 12 is activated to transmit sensing light through the optical fiber 44 to the input end of the input wand 28. Lenses 46 and 48 project the sensing light onto a first grating 50. The grating 50 is typically a multiple-slit ruling having equally spaced parallel transparent slits in an opaque substrate. The width of the slits and the spacing between the slits define the period of the grating. One preferred grating used in a 4× reduction system has 4 μm slits with 4 μm spacing to produce an 8 μm period. With 4× reduction, the period of the pattern of lines produced is 2 μm.

The pattern of lines produced by grating 50 is reflected by a fold mirror 54 toward the system fold mirror 16 or a separate mirror. The fold mirror 16 directs the line pattern through the projection lens 18. The grating 50 is located via the fold mirror 54 the same optical distance from the lens 18 as the reticle 14. It is therefore located at the effective or virtual object plane 52a of the lens 18.

An image of the line pattern from the grating 50 is formed by the projection lens 18 at an effective image plane 56a of the projection lens 18 via the fold mirror 58 in the receive wand 30. A second grating 60 is located at the effective image plane 56a of the lens 18.

The second grating 60 is also preferably a multiple-slit ruling. In one embodiment of the 4× system mentioned above, the grating 60 has 1.0375 μm slits and spaces for a 2.075 μm period. Hence, the two gratings 50, 60 have different periods such that a pattern of Moire fringes is formed at the output of the second grating 60. The Moire fringes are imaged by lens 64 and reflected by fold mirror 66 onto the two-dimensional CCD array 32 of the CCD processing system 35. The camera 33 receives signals from the array 32 and generates signals indicative of the light received at each pixel in the array 32.

The processor 34 reads the signals from the CCD camera 33 to analyze the Moire fringes to indicate shift in the focal plane or image plane 56 of the projection lens 18 as described below in detail. The processor 34 generates control signals which are forwarded to the actuation system 38 which preferably moves the system components shown within the dashed box 70 relative to the stage 24 to compensate for the shift in focus, as indicated above.

As shown in FIG. 1, in one embodiment, the plane 72 defined by the grating 60 is preferably tilted relative to the image plane 56a defining the plane of the imaged line pattern from the grating 50. The second grating 60 is preferably tilted such that its entire length is not within the depth of focus of the projection lens 18. Since Moire fringes will only be produced where the image of the line pattern from the first grating 50 is in focus on the second grating 60, the Moire fringes are not produced by the entire length of the second grating 60. The effect is illustrated in more detail in FIGS. 2A and 2B.

FIG. 2A shows a first grating 50a and a second grating 60a aligned in parallel planes. Light 80 from a source passes through the first grating 50a to form a line pattern which is directed through lens 18a. The lens 18a forms an image of the line pattern on the second grating 60a, which has a different period than the first grating 50a. As a result, Moire fringes 82 are produced and are focused onto the CCD array 32 by a lens 64a. Since the entire image of the line pattern from the first grating 50a is in focus across the entire second grating 60a, the Moire fringes 82 are formed across the entire array 32.

In FIG. 2B, the second grating 60a has been rotated about its vertical axis 84 such that only its central portion is within the depth of focus of the lens 18a. As a result, the Moire fringes 82a are reduced in length on the CCD array 32.

If the location of the focal plane of the lens 18a moves such as by thermal shift, the portion of the second grating 60a used to produce the Moire fringes will change, since a different portion of the grating 60a will be within the depth of focus of the lens 18a. As a result, the Moire fringes 82a will move horizontally along the CCD array 32. This is shown in more detail in FIGS. 3A–3C and 4A–4C.

Figure 3C:
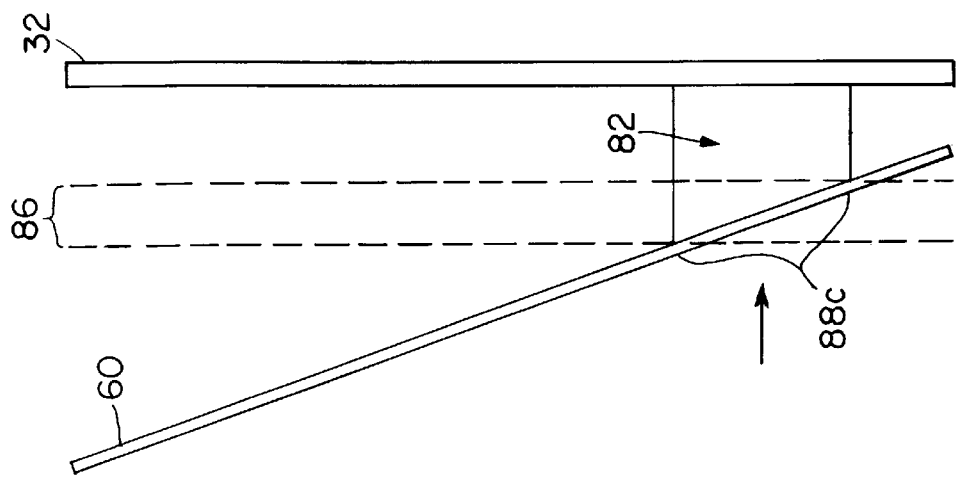
FIGS. 3A–3C are schematic diagrams illustrating shift of the range of focus of a lens with respect to the second grating of the invention.
Figure 3B:
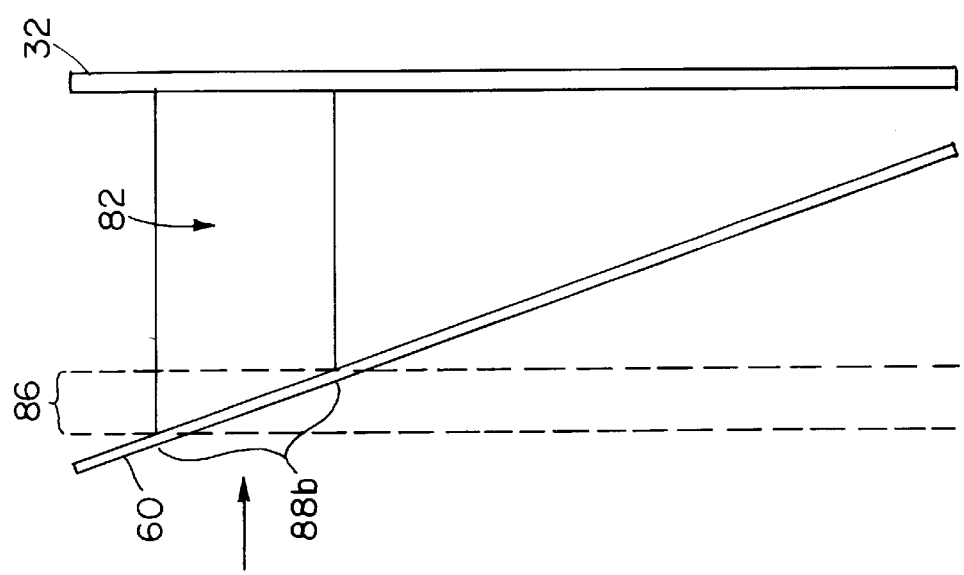
Figure 3A:
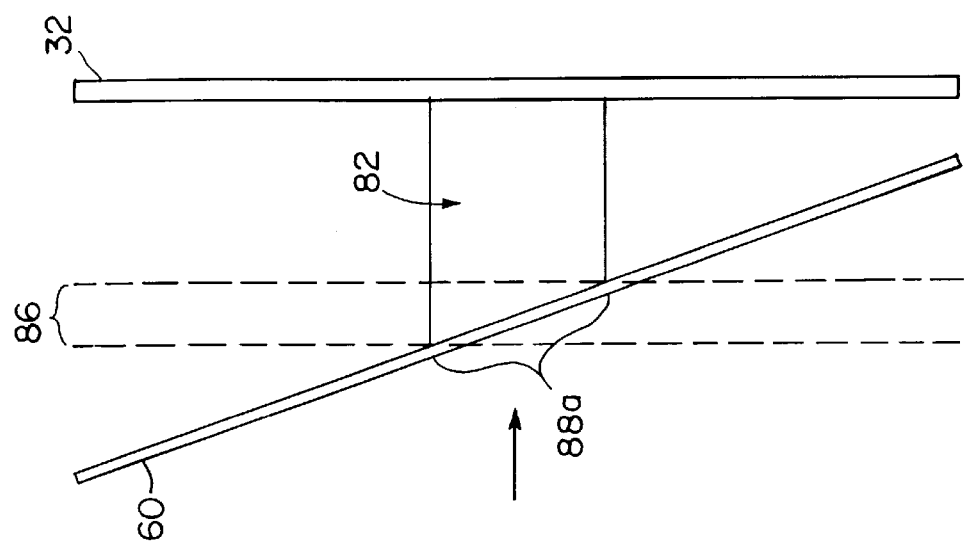
Figure 4A:
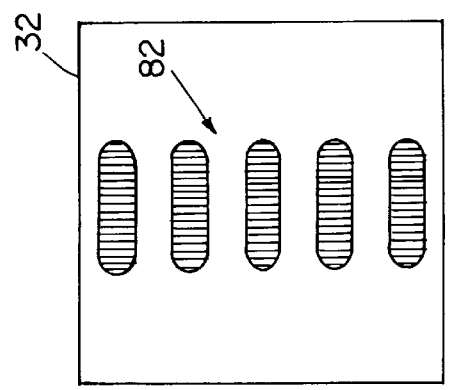
FIGS. 4A–4C show the Moire fringe pattern projections on the CCD array of the invention for each of FIGS. 3A–3C, respectively.

FIGS. 3A–3C show the relationship between the tilted second grating 60 and the range of focus 86 of the projection lens 18. In each of FIGS. 3A–3C, only the portion of the grating 60 that is within the range of focus 86 produces Moire fringes 82 for projection onto the CCD array 32. In FIG. 3A, the range of focus 86 falls across the center of the grating 60. Therefore, the central portion 88a of the grating 60 produces Moire fringes 82 and projects them onto the CCD array 32. FIG. 4A shows the corresponding front view of the CCD array 32, showing the Moire fringes 82 located at the center of the array 32.

Figure 4B:
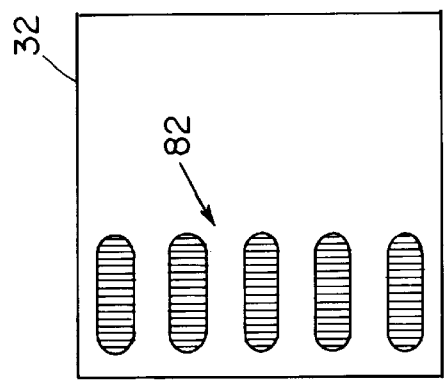

In FIG. 3B, the location of the range of focus 86 of the lens 18 has shifted to the left such as by thermal effects. A new portion 88b of the grating 60 falls within the range of focus 86 and is therefore used to produce the Moire fringe pattern 82 and project it onto the CCD array 32. FIG. 4B shows the front view of the array 32 in this situation. The Moire fringe pattern 82 is shown at the left edge of the array 32.

Figure 4C:
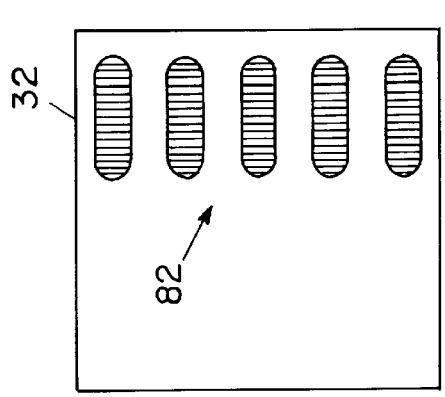

In FIG. 3C, the range of focus 86 has shifted to another region 88c of the grating 60. The Moire fringe pattern 82 is projected onto the CCD array 32 at its right edge, as also shown in FIG. 4C.

As mentioned above, the processor 34 receives signals to analyze the Moire fringe pattern 82 and determine its position on the CCD array 32. The processor 34, based on the analysis, generates control signals and forwards them to the actuation system 38 to adjust the system such that the focus of the lens is maintained at a predetermined desired position relative to the stage and substrate.

Figure 5A:
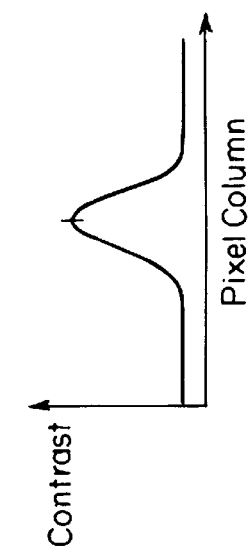
FIGS. 5A–5C are plots of contrast versus pixel column for the CCD array displays of FIGS. 4A–4C, respectively.
Figure 5B:
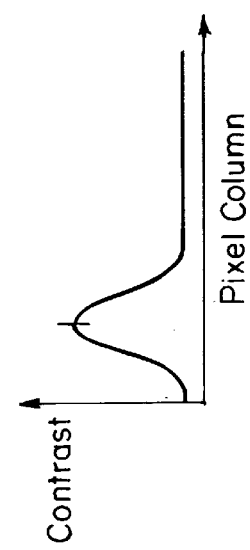
Figure 5C:
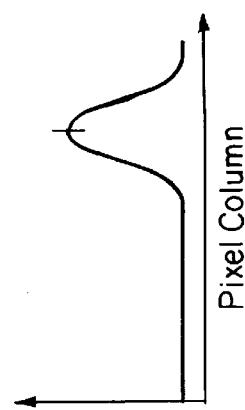

Referring to FIGS. 4A–4C and 5A–5C, the analysis involves computing an intensity contrast value for each column of pixels in the array 32. The pixel column which has the highest contrast value is concluded to be located at the center of the Moire pattern. FIGS. 5A–5C contain schematic plots of pattern contrast versus pixel column number for the Moire pattern projections of FIGS. 4A–4C, respectively. In FIGS. 4A and 5A, the peak value is approximately at the center of the array; in FIGS. 4B and 5B, the peak value is at the left side of the array 32; and in FIGS. 4C and 5C, the peak value is at the right side of the array 32. By tracking the location of the peak and, based on the location of the peak, adjusting the system to maintain the lens and the top surface of the substrate at a desired focus location, correction for focus shift is achieved.

In a preferred embodiment, the maximum contrast is identified by computing a Fast Fourier Transform for each column of the array 32. For each column, the Fourier coefficient at the frequency of the Moire pattern is identified. A predetermined threshold is set, and columns having a coefficient above the threshold are preferably segregated from the remaining columns. The segregated coefficient values are fit to a curve, which is preferably a parabola. The column at the peak of the parabola is identified as the column of highest contrast. This approach of fitting values to a curve reduces the effects of noise in the system which can cause inaccuracies in the computed Fourier coefficient values.

In the embodiment described thus far, movement of the Moire pattern from the cool lens position is sensed by counting the number of pixel columns between the cool lens peak column position and a current heated lens peak column position. The number of columns is translated into a focus shift distance. The actuating system (see FIG. 1) compensates for the focus shift by moving the elements shown in dashed box 70 the computed focus shift distance to maintain the focus of the lens at the top surface of the substrate. Alternatively, the stage 24 can be moved relative to the elements in box 70.

In order to translate number of pixel columns of Moire pattern shift to lens focus shift distance, the system of the invention preferably performs a calibration procedure before the exposure to calculate a constant coefficient having the units μm of focus shift per number of pixel columns of Moire pattern shift. In addition to this linear slope coefficient, an offset or intercept is also computed.

The calibration procedure involves first using a standard prior art stage sensor described above to determine the offset or intercept, i.e., the position of best focus of the lens and/or stage while the lens is cool. At the same time, while the lens is still cool, the focus shift sensor of the invention is activated to determine the peak pixel column of the Moire pattern on the CCD array 32 which corresponds to the cool lens best focus.

Next, the lens is flooded with illumination light for a period of time that allows the lens to heat to a temperature which is preferably beyond the highest temperature it will reach during any exposure. While the lens is hot, the stage sensor is again used to determine a new position of best focus, which will be different than the cool position due to thermal focus shift effects. The difference in the hot and cold focus positions measured by the stage sensor is calculated to determine a focus shift distance. While the lens is hot, the focus shift sensor of the invention is also activated again to determine the new hot position of the Moire pattern on the CCD array 32. The hot and cold array positions are compared to determine the total number of pixel columns the pattern has moved. Next, the total focus shift distance determined by the stage sensor is divided by the total number of shifted columns on the CCD array to compute the system coefficient.

During operation of the system, the focus shift sensor is used as described above to determine the amount of shift in the Moire pattern across the array, measured in the number of pixel columns. That number is multiplied by the coefficient calculated as described above to translate the number of columns into a focus shift distance. To compensate for the focus shift, the lens and/or stage are moved that calculated distance to return the focus of the lens to its desired position relative to the surface of the substrate.

Figure 6:
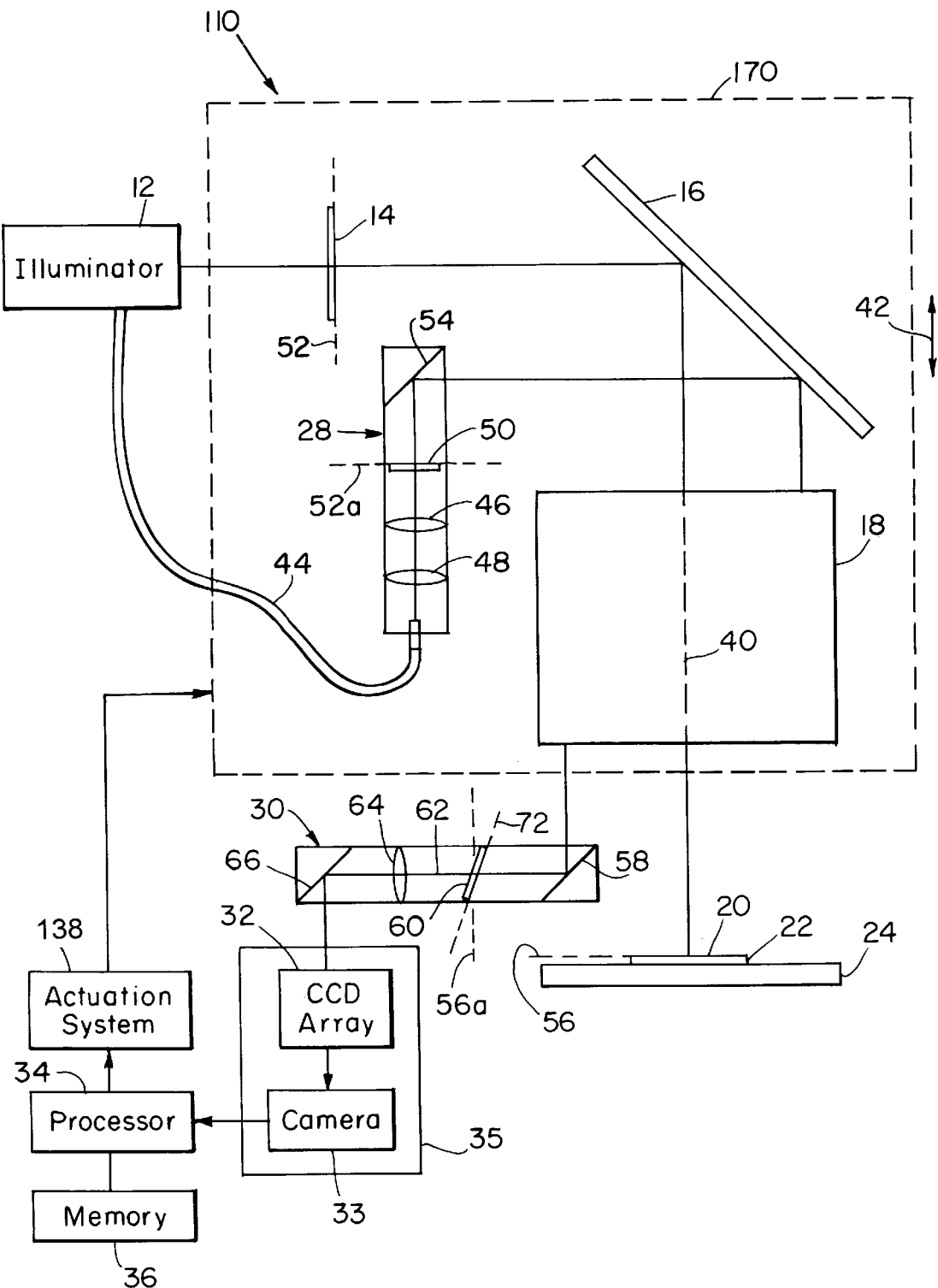
FIG. 6 is a schematic block diagram of an alternative embodiment of the focus shift sensor of the invention in a photolithography system.

In another embodiment of the system 110, as shown in block diagram form in FIG. 6, the receive wand 30 and, hence, the second grating 60 are mounted in the system 110 rigidly with respect to the stage 24.

The system 110 operates in the same manner as the embodiment 10 of the system described above to identify shift in the Moire pattern 82 across the CCD array 32. However, in this embodiment, it is not necessary to translate the number of shifted Moire pattern pixel columns into a focus shift distance. Since the grating 60 is rigid with respect to the stage 24, the actuation system 138 need only move the items in box 170 relative to the stage 24 to keep the center of the Moire pattern 82 at a desired pixel column. It is not necessary to calculate an actual amount of focus shift. If the Moire pattern is kept in a stationary position, then the focus position of the lens will also necessarily remain stationary.

It should be noted that in any embodiment of the invention it is not necessarily the case that the Moire pattern 82 should initially be located at the center of the CCD array 32. In fact, it is preferable that at the beginning of the exposure, the pattern be positioned at one edge of the array 32 since it is known that all of the net focus shift will occur in a single direction.

While this invention has been particularly shown and described with references to preferred embodiments thereof, it will be understood by those skilled in the art that various changes in form and details may be made therein without departing from the spirit and scope of the invention as defined by the appended claims.

The invention claimed is:

1. An apparatus for sensing focus shift in a projection system comprising:
   a light source that illuminates a reticle, and
   a projection system that images the reticle on a substrate;
   wherein the focus shift apparatus comprises:
   a first optical element;
   a light source directing light through the first optical element to generate a first light pattern, the first light pattern being directed through the projection system;
   a second optical element that receives an image of the first light pattern from the projection system and generates a pattern of Moire fringes therefrom; and
   a detection subsystem that receives the pattern of Moire fringes and senses change in position of the Moire fringes to determine shift in focus of the projection system and to generate a signal indicative of the shift in focus of the projection system.

2. The apparatus of claim 1 further comprising a controller that receives the signal indicative of the shift in focus and corrects for the shift in focus of the projection system.

3. The apparatus of claim 1 wherein the first optical element comprises a first grating and the second optical element comprises a second grating.

4. The apparatus of claim 3 wherein a plane defined by the second grating is tilted relative to an image of the first light pattern from the first grating such that Moire fringes are generated.

5. The apparatus of claim 3 wherein a first period of the first grating is different from a second period of the second grating.

6. The apparatus of claim 1 wherein a first period of the first optical element is different from a second period of the second optical element.

7. The apparatus of claim 1 wherein the detection system comprises a CCD array that receives the Moire fringes and generates electrical signals indicative of the Moire fringes.

8. The apparatus of claim 7 further comprising a processor that receives the electrical signals generated by the CCD array and that generates signals therefrom indicative of spatial frequency along a first dimension of the pattern of Moire fringes.

9. An apparatus for sensing focus shift in a projection system comprising:
   a first optical element;
   a light source directing light through the first optical element to generate a first light pattern, the first light pattern being directed through the projection system;

a second optical element that receives an image of the first light pattern from the projection system and generates a pattern of Moire fringes therefrom; and a detection subsystem that receives the pattern of Moire fringes and senses change in position of the Moire fringes to determine shift in focus of the projection system and to generate a signal indicative of the shift in focus of the projection system, the detection system comprising a CCD array that receives the Moire fringes and generates electrical signals indicative of the Moire fringes, and a processor that receives the electrical signals generated by the CCD array and that generates signals therefrom indicative of spatial frequency along a first dimension of the pattern of Moire fringes by computing a Fast Fourier Transform.

10. An apparatus for sensing focus shift in a projection system comprising:

a first optical element;

an optical fiber that directs light through the first optical element to generate a first light pattern, the first light pattern being directed through the projection system;

a second optical element that receives an image of the first light pattern from the projection system and generates a pattern of Moire fringes therefrom; and a detection subsystem that receives the pattern of Moire fringes and senses changes in position of the Moire fringes to determine shift in focus of the projection system and to generate a signal indicative of the shift in focus of the projection system.

11. A photolithography system comprising:

a first light source for directing light through a reticle to produce patterned light for projection onto a workpiece;

a projection system for receiving the patterned light from the reticle and forming an image of the patterned light on the workpiece; and a sensor subsystem for detecting focus shift in the projection system comprising:

a second light source for supplying sensing light, a first optical element for receiving the sensing light and generating a first sensing pattern therefrom and directing the first sensing pattern through the projection system, a second optical element for receiving the first sensing pattern from the projection system and forming a second sensing pattern, and a detector for receiving the second sensing pattern and analyzing the second sensing pattern to determine shift in focus of the projection system and to generate a signal indicative of the shift in focus of the projection system.

12. The photolithography system of claim 11 further comprising a controller that receives the signal from the detector and corrects for the shift in focus.

13. The photolithography system of claim 11 wherein the first optical element comprises a first grating and the second optical element comprises a second grating.

14. The photolithography system of claim 13 wherein the first grating has a first period and the second grating has a second period different from the first period such that the second sensing pattern comprises a pattern of Moire fringes.

15. The photolithography system of claim 14 wherein a plane defined by the second grating is tilted relative to an image of the first sensing pattern such that the Moire fringes are generated by only a portion of the second grating.

16. The photolithography system of claim 14 wherein the detector comprises a CCD array that receives the Moire fringes and generates electrical signals indicative of the Moire fringes.

17. The photolithography system of claim 16 wherein the detector comprises a processor that receives the electrical signals generated by the CCD array and that generates signals therefrom indicative of spatial frequency along a first dimension of the pattern of Moire fringes.

18. The photolithography system of claim 11 wherein the detector comprises a CCD array that receives the second sensing pattern and generates electrical signals indicative of the second sensing pattern, the detector analyzing the signals to determine the shift in focus of the projection system.

19. The photolithography system of claim 11 wherein the second light source comprises an optical fiber coupling the sensing light from the first light source toward the first optical element.

20. A method of sensing focus shift in a projection system comprising:

providing a first optical element;

directing light through the first optical element to generate a first light pattern;

directing the first light pattern through the projection system that is used to form an image of a reticle on a substrate;

providing a second optical element after the projection system;

with the second optical element, receiving an image of the first light pattern from the projection system and generating a pattern of Moire fringes therefrom;

receiving the pattern of Moire fringes;

sensing change in position of the Moire fringes to determine shift in focus of the projection system; and generating a signal indicative of the shift in focus of the projection system.

21. The method of claim 20 further comprising:

receiving the signal indicative of the shift in focus of the projection system; and using the signal, correcting for the shift in focus of the projection system.

22. The method of claim 20 wherein the first optical element comprises a first grating and the second optical element comprises a second grating.

23. The method of claim 22 further comprising tilting the second grating relative to an image of the first light pattern from the first grating such that Moire fringes are generated by only a portion of the second grating.

24. The method of claim 22 wherein a first period of the first grating is different from a second period of the second grating.

25. The method of claim 20 wherein a first period of the first optical element is different from a second period of the second optical element.

26. The method of claim 20 wherein the pattern of Moire fringes is received by a CCD array, the CCD array generating electrical signals indicative of the Moire fringes.

27. The method of claim 26 further comprising:

receiving the electrical signals generated by the CCD array; and using the electrical signals generated by the CCD array, generating signals indicative of spatial frequency along a first dimension of the pattern of Moire fringes.

28. The method of claim 27 further comprising computing a Fast Fourier Transform to generate the signals indicative of spatial frequency of the Moire fringes.

29. The method of claim 20 wherein the light is directed through the first optical element by an optical fiber.

30. A method of sensing shift in focus of a projection system in a photolithography system, the photolithography system including a first light source for directing light through a reticle to produce patterned light, said patterned light being directed through the projection system and imaged onto a workpiece, said method comprising:

directing sensing light from a second light source onto a first optical element;

with the first optical element, generating a first sensing pattern;

directing the first sensing pattern through the projection system;

directing an image of the first sensing pattern from the projection system onto a second optical element;

using the second optical element, forming a second sensing pattern;

with a detector, receiving the second sensing pattern and analyzing the second sensing pattern to determine shift in focus of the projection system;

generating a signal indicative of the shift in focus of the projection system; and using the projection system to form an image of a reticle on a substrate.

31. The method of claim 30 further comprising:

receiving the signal indicative of the shift in focus from the detector; and using the signal, correcting for the shift in focus.

32. The method of claim 30 wherein the first optical element comprises a first grating and the second optical element comprises a second grating.

33. The method of claim 32 wherein the first grating has a first period and the second grating has a second period different from the first period such that the second sensing pattern comprises a pattern of Moire fringes.

34. The method of claim 33 further comprising tilting a plane defined by the second grating relative to an image of the first sensing pattern such that the Moire fringes are generated by only a portion of the second grating.

35. The method of claim 33 wherein the second sensing pattern is received by a CCD array, the CCD array generating electrical signals indicative of the Moire fringes.

36. The method of claim 35 further comprising:

receiving the electrical signals generated by the CCD array; and using the electrical signals from the CCD array, generating signals indicative of spatial frequency along a first dimension of the pattern of Moire fringes.

37. The method of claim 30 wherein the second sensing pattern is received by a CCD array, the CCD array generating electrical signals indicative of the second sensing pattern, the detector analyzing the signals to determine the shift in focus of the projection system.

38. The method of claim 30 wherein the second light source comprises an optical fiber coupling the sensing light from the first light source toward the first optical element.

39. The apparatus of claim 3 wherein a plane defined by the second grating is tilted out of a plane defined by an image of the first light pattern from the first grating such that Moire fringes are generated by only a portion of the second grating.

40. The method of claim 22 further comprising tilting the second grating out of a plane defined by an image of the first light pattern from the first grating such that Moire fringes are generated by only a portion of the second grating.

41. The apparatus of claim 1 wherein the second optical element is rigid with respect to a stage that holds the substrate.

42. The method of claim 20 further comprising:

rigidly locating the second optical element with respect to a stage that holds the substrate; and controlling the projection system to maintain the position of the Moire fringes to counteract shifts in the focus of the projection system.

43. The method of claim 30 further comprising:

rigidly locating the second optical element with respect to a stage that holds the substrate; and controlling the projection system to stabilize the second sensing pattern to counteract shifts in the focus of the projection system.

* * * * *